United States Patent [19]

Alaspa et al.

[11] 4,006,491
[45] Feb. 1, 1977

[54] INTEGRATED CIRCUIT HAVING INTERNAL MAIN SUPPLY VOLTAGE REGULATOR

[75] Inventors: Allan A. Alaspa; Robert R. Beutler, Tempe, Ariz.

[73] Assignee: Motorola, Inc., Chicago, Ill.

[22] Filed: May 15, 1975

[21] Appl. No.: 577,968

[52] U.S. Cl. .................................. 357/23; 357/41; 357/42; 357/52; 307/303; 307/304
[51] Int. Cl.² ................. H01L 29/78; H01L 27/02; H01L 29/34; H03K 3/26
[58] Field of Search .................. 357/23, 52, 41, 42; 307/303, 304

[56] References Cited
UNITED STATES PATENTS

| | | | |
|---|---|---|---|
| 3,753,806 | 8/1973 | Adamic | 357/52 |
| 3,798,512 | 3/1974 | Critchlow | 357/52 |
| 3,798,513 | 3/1974 | Ono | 357/52 |
| 3,886,583 | 5/1975 | Wang | 357/52 |
| 3,925,120 | 12/1975 | Saida et al. | 357/52 |

Primary Examiner—Andrew J. James
Attorney, Agent, or Firm—Charles R. Hoffman

[57] ABSTRACT

A complementary field effect transistor integrated circuit includes an input buffer, internal high density logic circuitry having a collapsed guard ring structure associated therewith, an internal power source which provides operating voltage for the internal high density logic lower than the junction reverse breakdown voltage of the collapsed guard ring structure, and an output level shifter circuit. The output level shifter circuit and input buffer, and internal power source have a conventional non-collapsed guard ring structure associated therewith.

2 Claims, 3 Drawing Figures

INTEGRATED CIRCUIT HAVING INTERNAL MAIN SUPPLY VOLTAGE REGULATOR

BACKGROUND OF THE INVENTION

Complementary integrated circuit field effect transistor devices utilizing guard ring structures spaced from each other and from source and drain regions are well known in the art. Recent advances in the art have provided collapsed guard ring structures in which the guard rings abut or are very closely spaced from source and drain regions of the various P Channel and N Channel MOSFETs in the integrated structure and from each other. However, the so-called collapsed guard ring structures have reverse breakdown PN junction characteristics which are relatively low, typically approximately 5-7 volts. The more conventional non-collapsed guard ring structures for complementry field effect transistor integrated circuits, also called CMOS integrated circuits, typically operate suitably over a wide range of power supply voltages, varying from lower than 3 volts to greater than 18 volts. Thus, CMOS circuits manufactured using the collapsed guard ring structure have been incompatible with prior non-collapsed guard ring CMOS circuits for high voltage applications.

SUMMARY OF THE INVENTION

It is an object of the invention to provide a CMOS integrated circuit having an internal high density logic section utilizing collapsed guard ring structures operating between an external voltage conductor and an internal (or external) power supply which generates a voltage which permits the internal high density logic section to operate below the reverse breakdown voltage of the collapsed guard ring structures when large external power supply voltages are applied to the CMOS integrated circuit.

It is another object of the invention to provide a CMOS integrated circuit having peripheral circuitry utilizing a non-collapsed guard ring structure and internal high density logic circuitry portion utilizing collapsed guard ring internal power supply structures for supplying power to the internal high density logic circuitry portion.

Briefly described, the invention is a complementary field effect transistor integrated semiconductor chip including an internal portion of complementary field effect transistor circuitry having collapsed guard rings associated therewith and a second peripheral portion of complementary field effect transistor circuitry having non-collapsed guard rings associated therewith.

DESCRIPTION OF THE INVENTION

Figure 1:
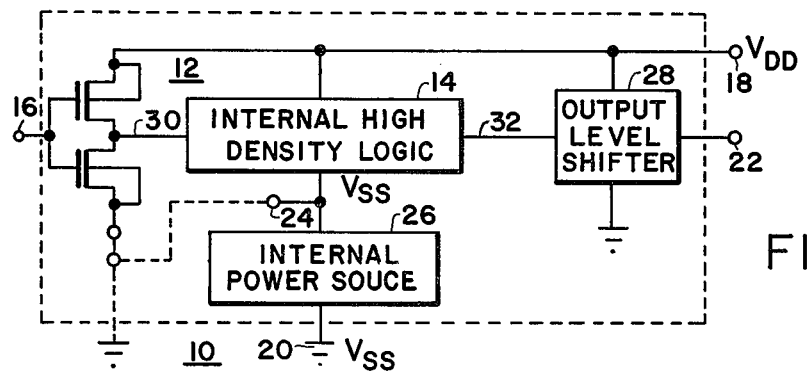
FIG. 1 is a block diagram of a presently preferred embodiment of the invention.
Figure 3:
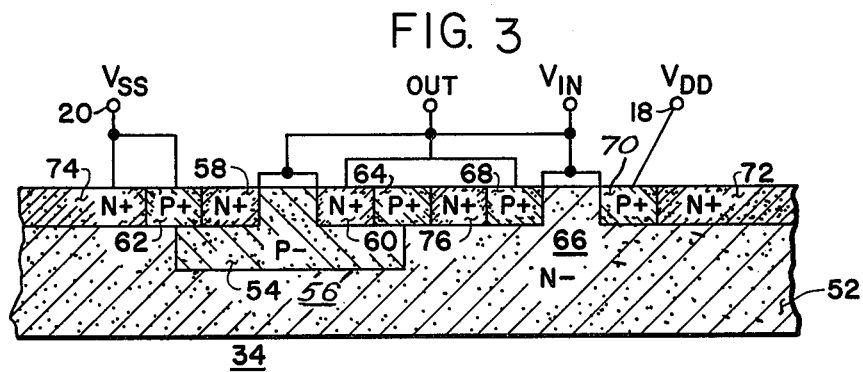
FIG. 3 is a cross section diagram of a collapsed ring CMOS integrated circuit structure which may be utilized in section 14 of FIG. 1.

FIG. 1 depicts CMOS integrated circuit chip 10 which includes input level shifting circuit 12, which has its input connected to input conductor 16 and its output connected to conductor 30. CMOS chip 10 also includes internal high density logic circuitry portion 14, which is fabricated utilizing a collapsed guard ring structure such as illustrated in FIG. 3. High density logic circuitry 14 is coupled between $V_{DD}$ supply conductor 18 and $V_{SS}'$ conductor 24 and is further connected to conductors 30 and 32. Internal power source 26 is connected between $V_{SS}$ conductor 20 and $V_{SS}'$ conductor 24.

An exemplary embodiment of internal power source 26 is described in detail in copending patent application entitled "INTEGRABLE VOLTAGE SUPPLY", by Alaspa, et al., Ser. No. 577,818 filed on even date herewith. Internal power source 26 acts to generate an internal supply voltage between $V_{DD}$ and $V_{SS}'$ less in magnitude than the breakdown voltages associated with collapsed guard rings, described hereinafter. Such breakdown voltages may be between opposite conductivity type guard rings and/or source or drain regions of MOSFETs.

Input level shifting circuit 12 is coupled between $V_{DD}$ conductor 18 and one or the other of $V_{SS}$ or $V_{SS}'$, as indicated by the dotted lines.

Output level shifter 28 is connected between $V_{DD}$ and $V_{SS}$ and has an output connected to output terminal 22 and is also connected to conductor 32.

Figure 2:
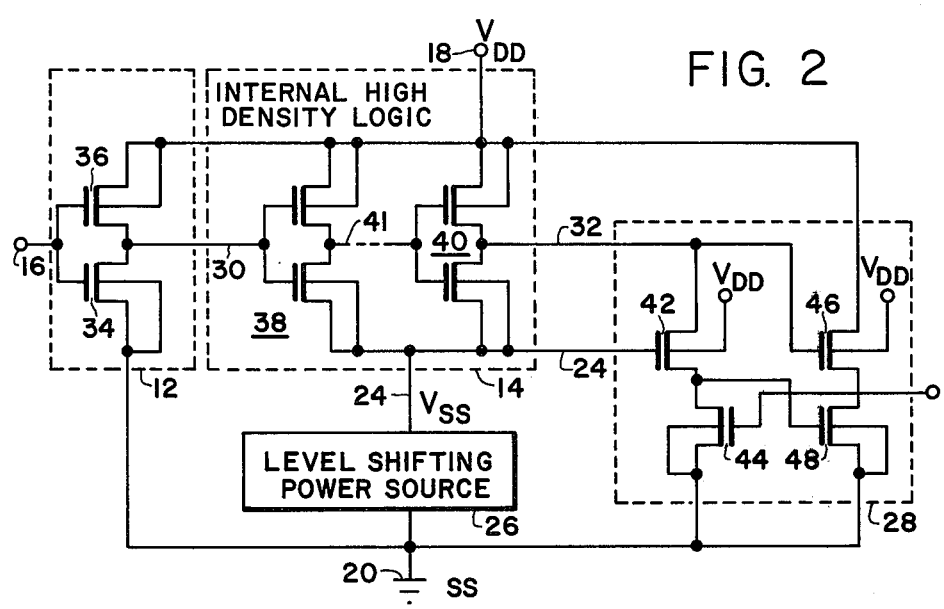
FIG. 2 is a circuit schematic diagram of an embodiment of the invention.

An exemplary embodiment of output level shifter 28 is depicted in FIG. 2 also by reference numeral 28 and is described in substantial detail in U.S. Pat. No. 3,801,831, entitled "VOLTAGE LEVEL SHIFTING CIRCUIT" by Dame, and assigned to the present assignee. (It should be noted that the P Channel and N Channel MOSFETs are reversed in the Dame patent, however).

The embodiment of FIG. 1 is illustrated in more detail in the circuit schematic of FIG. 2, which shows that input level shifter 12 includes P Channel MOSFET 36 and N Channel MOSFET 34 having gate electrodes coupled to input conductor 16 to form a conventional CMOS inverter having output node 30 and being coupled between $V_{DD}$ and $V_{SS}$.

CMOS inverter 12, according to the invention, is fabricated utilizing the non-collapsed guard ring structure, in which guard rings such as 62, 64, 76 in the structure of FIG. 3 are spaced from the adjacent source and/or drain regions (MOSFET devices are well known in the semiconductor art; however, a thorough description of MOSFET devices see "Physics and Technology of Semiconductor Devices," A. S. Grove, John Wiley and Sons, 1967.) and from each other by a minimum distance, typically 0.4 for one known CMOS manufacturing process. FIG. 3 illustrates a typical CMOS integrated circuit structure 38 utilizing collapsed guard rings. N-type semiconductor substrate 52 has a P-type tub 54 therein and extending to the upper surface of substrate 52. An N channel MOSFET 56 including an N+ source region 58 and an N+ drain region 60 is formed in P-type tub 54. P+ guard ring 62 and 64 is provided in the upper surface of CMOS circuit 38 to block parasitic surface leakage paths which otherwise might be formed between various N+ regions in tub 54. Although it is not clear from the section view of FIG. 3, a plurality of other N channel MOSFETs could also be fabricated in P-type tub 54, and therefore guard rings are needed to block parasitic leakage paths along the surface induced between such N channel MOSFETs by voltages on metal conductors or other phenomena.

As shown in FIG. 3, the N-type substrate 52 is typically biased at $V_{DD}$ volts, which for example, may be ground potential. Also, P+ guard ring 62, and therefore P type tub 54, are both biased at $V_{SS}$ volts.

P-type MOSFET 66 is fabricated in N-type substrate 52 and includes source region 70, which may be connected to $V_{DD}$ for example, and P+ drain region 68. P channel MOSFET 66 is surrounded by a collapsed N+ guard ring 76 and 72. Note that the gate electrodes of MOSFETs 56 and 66 are connected together and also that the drain electrodes 60 and 68 are connected together to form an output terminal. Thus, the circuit depicted in FIG. 3 is actually a CMOS inverter such as CMOS inverter 12 in FIGS. 1 and 2. The term "collapsed guard ring" merely means that the various guard ring regions, such as 62, 64, 76 and 72, do not have to be spaced a minimum distance, typically 0.4 mils, from each other or from adjacent source or drain regions. Rather, they may abut each other or be spaced by a very small distance, typically no more than 0.1 mils. Therefore, the physical area required by any CMOS circuitry on a surface of a semiconductor substrate is substantially less for CMOS circuitry utilizing a collapsed guard ring structure than is required for CMOS circuitry utilizing a convention non-collapsed guard ring structure. Internal high density circuitry 14 is illustrated in FIG. 2 as including input inverter 38 and output inverter 40. The dotted line 41 between the two designates generalized CMOS circuitry which will normally, but not necessarily always, interface with an input and an output stage such as inverters 38 and 40, respectively.

The output level shifter 28 includes P Channel MOSFETs 42 and 46 and N Channel MOSFETs 44 and 48. MOSFETs 42 and 44 are coupled in series between conductors 32 and $V_{SS}$ conductor 20. The gate of MOSFET 42 is connected to $V_{SS}'$. MOSFETs 46 and 48 are connected in series between $V_{DD}$ and $V_{SS}$. The gate of MOSFET 46 is connected to conductor 32, and the gate of MOSFET 48 is connected to the drains of MOSFETs 42 and 44. The gate of MOSFET 44 is connected to the drains of MOSFETs 46 and 48, which are also connected to output conductor 22. The operation is described in detail in the above mentioned U.S. Patent by Dame et al.

Briefly, the operation of output level shifter 28 is that if the voltage on conductor 32 is at approximately $V_{DD}$ volts representing a logical 1, P channel MOSFET 46 is off, and P channel MOSFET 42 is on, so that the gate of MOSFET 48 is at $V_{DD}$ volts and N Channel MOSFET 48 is on, holding the output voltage at node 22 to $V_{SS}$ volts and turning MOSFET 44 off.

However, if conductor 32 is at $V_{SS}'$ volts, representing a logical 0, MOSFET 46 is on and MOSFET 42 is off, so that the output voltage of conductor 22 is at $V_{DD}$ volts and MOSFET 44 is on, pulling the gate of MOSFET 48 to ground and turning MOSFET 48 off.

Thus, it is seen that the input signals at conductor 16 and the output signals at conductor 22 have logical 1 and 0 levels of $V_{DD}$ and $V_{SS}$ volts, respectively, where if the logic levels of circuitry in internal logic section 14 have logical 1 and levels of $V_{DD}$ and $V_{SS}'$ volts, respectively.

As described in the above-mentioned copending patent application by Alaspa et al., the voltage difference between $V_{DD}$ and $V_{SS}'$ may be designed to be a relatively constant value less than the typical breakdown voltage of approximately 6 volts between collapsed N+ and P+ guard rings such as shown in FIG. 3. However, the externally applied power supply voltage difference between $V_{DD}$ and $V_{SS}$ may vary from approximately 3 to approximately 18 volts or greater in typical application, for known conventional CMOS circuitry.

It should be noted that the internal voltage power source 26 could, within the scope of the invention, be connected between $V_{DD}$ and $V_{SS}'$ and the internal high density logic circuitry portion 14 could be connected between $V_{SS}$ and $V_{SS}'$ if a somewhat different CMOS structure than those of FIG. 3 is utilized.

In summary, the advantage of high density internal logic having collapsed guard ring construction operating at low internal voltage levels and peripheral circuitry utilizing conventional guard ring technology and capable of withstanding a high applied voltage is provided by the inventions. The user need not even be aware of the internal operation of the circuit.

What is claimed is:

1. A complementary field-effect transistor integrated circuit semiconductor chip comprising a first internal portion of complementary field-effect transistor circuitry having collapsed guard rings therein and a second peripheral portion of complementary field-effect transistor circuitry having non-collapsed guard rings therein, said collapsed guard rings including guard rings substantially contiguous with source and drain regions of said field-effect transistors of said first internal portion and of opposite conductivity type to said source and drain regions in said first internal portion, said non-collapsed guard rings including guard rings substantially spaced from source and drain regions of said field-effect transistors of said second peripheral portion and of opposite conductivity type to said source and drain regions in said second peripheral portion.

2. A complementary field effect transistor semiconductor chip including a first voltage conductor connected to a voltage input of said semiconductor chip and a second voltage conductor connected to a second voltage input of said semiconductor chip, an input signal conductor and an output signal conductor, said semiconductor chip comprising:

an internal voltage conductor;

complementary field effect transistor internal power source means coupled between said second voltage conductor and said internal voltage conductor for generating an internal supply voltage on said internal voltage conductor, said complementary field-effect transistor internal power source means including collapsed guard rings said collapsed guard rings having a first breakdown voltage associated therewith said internal supply voltage being less in magnitude than the magnitude of said first breakdown voltage;

an internal portion of complementary field effect transistor circuitry coupled between said first voltage conductor and said internal conductor and including collapsed guard rings substantially contiguous with and of conductivity type opposite to that of sources and drains of said field effect transistors of said internal portion of a complementary field effect transistor circuitry;

an input complementary field effect transistor circuitry section coupled between said internal portion of circuitry and said input conductor and coupled between said first and second voltage conductors and including non-collapsed guard rings substantially spaced from and of opposite conductivity type to source and drain regions of said field effect transistors of said input complementary field effect transistor circuitry section; and an output complementary field effect transistor circuitry section coupled between said internal portion of circuitry and said output conductor and between said first and second voltage conductors and also coupled to said internal voltage conductor and including non-collapsed guard rings substantially spaced from and of opposite conductivity type to source and drain regions of said field effect transistors of said output complementary field effect transistor circuitry section.

* * * * *